(12) United States Patent
Bao et al.

(10) Patent No.: US 12,471,355 B2
(45) Date of Patent: Nov. 11, 2025

(54) NON-OVERLAPPING GATE CONDUCTORS FOR GAA TRANSISTORS

(71) Applicant: INTERNATIONAL BUSINESS MACHINES CORPORATION, Armonk, NY (US)

(72) Inventors: Ruqiang Bao, Niskayuna, NY (US); Eric Miller, Albany, NY (US); Dechao Guo, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 453 days.

(21) Appl. No.: 18/070,050

(22) Filed: Nov. 28, 2022

(65) Prior Publication Data

US 2024/0178072 A1 May 30, 2024

(51) Int. Cl.
| | |
|---|---|
| *H10D 84/03* | (2025.01) |
| *H01L 21/28* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/85* | (2025.01) |

(52) U.S. Cl.
CPC ..... *H10D 84/038* (2025.01); *H01L 21/28088* (2013.01); *H10D 30/014* (2025.01); *H10D 30/43* (2025.01); *H10D 30/6735* (2025.01); *H10D 30/6739* (2025.01); *H10D 62/121* (2025.01); *H10D 64/017* (2025.01); *H10D 84/0167* (2025.01); *H10D 84/0177* (2025.01); *H10D 84/85* (2025.01)

(58) Field of Classification Search
None
See application file for complete search history.

(56) References Cited

U.S. PATENT DOCUMENTS

| | | |
|---|---|---|
| 8,222,132 B2 | 7/2012 | Lee et al. |
| 8,658,525 B2 | 2/2014 | Yeh et al. |
| 8,669,167 B1 | 3/2014 | Chang et al. |
| 8,896,053 B2 | 11/2014 | Chakihara et al. |
| 10,319,846 B1 | 6/2019 | Ando et al. |
| 10,332,803 B1 | 6/2019 | Xie et al. |
| 10,510,620 B1 | 12/2019 | Chanemougame et al. |
| 10,692,778 B2 | 6/2020 | Bao et al. |

(Continued)

FOREIGN PATENT DOCUMENTS

| | | |
|---|---|---|
| CN | 102214579 B | 10/2011 |
| KR | 101738738 B1 | 5/2017 |

(Continued)

*Primary Examiner* — Steven B Gauthier
*Assistant Examiner* — Lamont B Koo
(74) *Attorney, Agent, or Firm* — Tutunjian & Bitetto, P.C.; Samuel Waldbaum

(57) ABSTRACT

Semiconductor devices and methods of forming the same include a first transistor in a first region having a first work function metal layer. A second transistor in a second region has a second work function metal layer that overlaps a portion of the first work function metal layer and that has a vertical part above the portion of the first work function metal layer.

10 Claims, 6 Drawing Sheets

(56) References Cited

U.S. PATENT DOCUMENTS

| | | | |
|---|---|---|---|
| 2018/0342427 A1* | 11/2018 | Xie | H01L 21/32139 |
| 2020/0006356 A1* | 1/2020 | Ando | B82Y 10/00 |
| 2020/0083051 A1* | 3/2020 | Wang | H10D 30/0323 |
| 2021/0328018 A1 | 10/2021 | Cheng et al. | |
| 2021/0376138 A1 | 12/2021 | Lee et al. | |
| 2022/0149041 A1 | 5/2022 | Huang et al. | |

FOREIGN PATENT DOCUMENTS

| | | |
|---|---|---|
| KR | 101771278 B1 | 8/2017 |
| TW | 201935695 A | 9/2019 |

* cited by examiner

NON-OVERLAPPING GATE CONDUCTORS FOR GAA TRANSISTORS

BACKGROUND

The present invention generally relates to semiconductor device fabrication and, more particularly, to the fabrication of gate-all-around (GAA) transistors with differing work function metals.

Integrated circuits may include multiple different types of transistor device. For example, p-type field effect transistors (pFETs) and n-type field effect transistors (nFETs) may be used together on a given circuit, for example to form a complementary field effect transistor (CFET) device. To tune the voltage thresholds of the pFETs and nFETs, different respective work function metals may be used on each type of device. A second conductive material may be layered over the work function metal to form a gate contact.

SUMMARY

A semiconductor device includes a first transistor on a substrate, having a first work function metal layer. A second transistor on the substrate has a second work function metal layer that overlaps a portion of the first work function metal layer and that has a vertical part above the portion of the first work function metal layer relative to the substrate.

A semiconductor device includes a first transistor and a second transistor. The first transistor includes a first channel over a substrate, a first work function metal layer on the first channel, and a first gate conductor over the first work function metal layer. The second transistor includes a second channel over the substrate, a second work function metal layer, on the second channel, that overlaps a portion of the first work function metal layer and that has a vertical part above the portion of the first work function metal layer relative to the substrate, and a second gate conductor over the second work function metal layer.

A method of forming a semiconductor device includes masking a dummy gate material in a first device region. The dummy gate material is etched in a second device region, including an isotropic etch that recesses the dummy gate in the first device region to form an undercut under a mask. A barrier layer is formed in the undercut. A first work function metal is etched away from the second device region after forming the barrier layer. The barrier layer is etched away. A second work function metal layer is deposited in the second device region, including a portion of overlap with the first work function metal.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

When forming semiconductor devices with different polarities on a single chip, such as p-type field effect transistors (pFETs) and n-type field effect transistors (nFETs), different work function metals may be used on the respective device types to adjust the voltage thresholds as needed. For example, the work function metals may include different compositions differ in polarity or in magnitude of their effect on the voltage threshold of the transistor device.

In some cases, the fabrication process may include layering different work function metals on top of one another. For example, if a p-type work function metal is deposited first while the n-type device is masked, then an n-type work function metal may subsequently be deposited in both device regions, layering n-type work function metal over the p-type work function metal, without masking the p-type device region. The n-type work function metal may remain in a functional p-type device because the effect of the work function metal has a limited range. As a result, the effect of the work function metal that is closer to the device's channel may dominate, such that other work function metals may safely be used over it. As a result, some fabrication processes simply layer work function metals on top of one another, with the extra work function metal serving as part of the gate conductor structure.

However, as transistor devices scale to ever smaller sizes, the gate length of the devices scales to shorter dimensions as well. Such scaling may necessitate thinner work function metal layers. However, thinner work function metal layers may have less of a masking effect, such that the effect of any overlying work function metal of a different polarity type may become significant. The overlying work function metal may then exert an influence on the voltage threshold of the device. For example, if a thin p-type work function metal is used on the channel of a p-type device, the p-type work function metal may not be able to fully shield the channel from an overlying n-type work function metal layer. As a result, the efficacy of the thin work function may be diminished by the close proximity of the overlying work function metal.

To prevent the second work function metal from being deposited on a device with a different first work function metal, a barrier may be used to protect a first device region (e.g., a p-type device region) while the work function metal for that region is removed from a second device region (e.g., an n-type device region). An isotropic etch may be used in the second device region to completely remove the first work function metal, while the barrier prevents damaging the first work function metal layer of the first device region. A second work function metal may then be deposited in the second device region, as the mask blocks the second work function metal from being deposited on the channel of the first device region.

Figure 1:
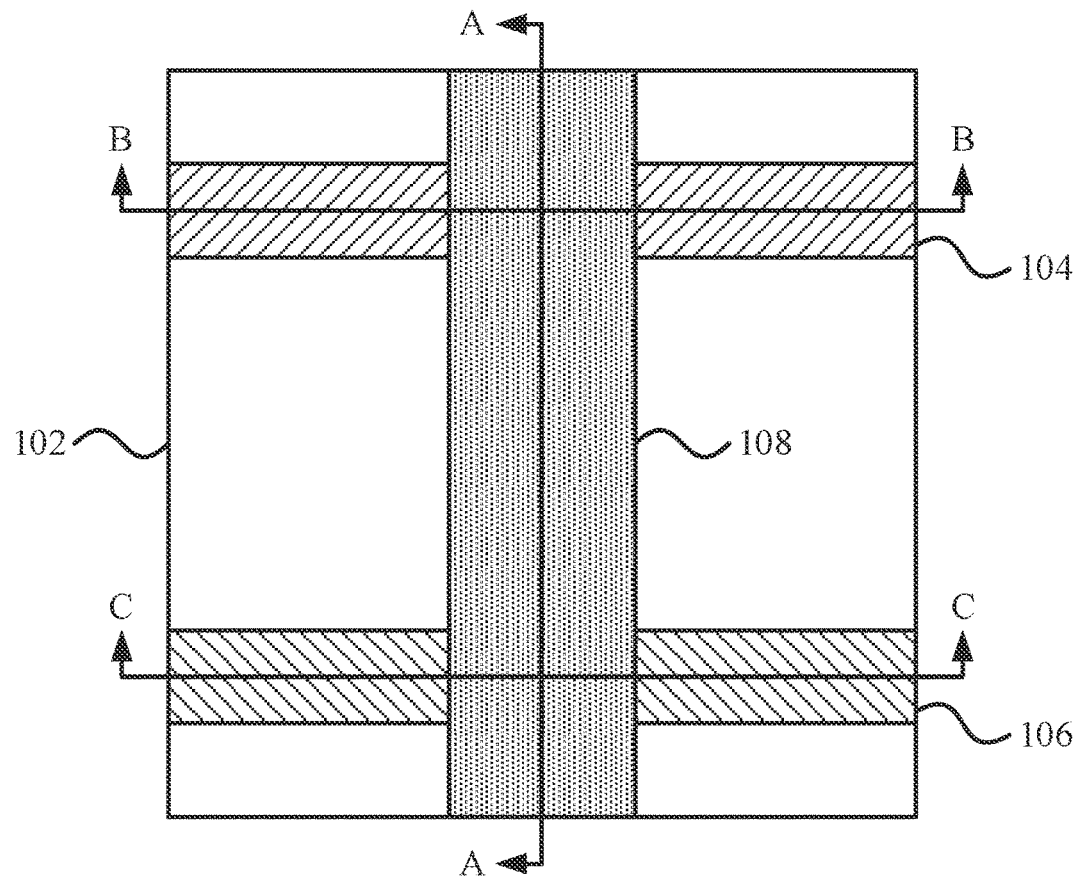
FIG. 1 is a top-down view of a step in the fabrication of a semiconductor device having transistors with different work function metals, showing cross-sections AA, BB, and CC, in accordance with an embodiment of the present invention.

Referring now to FIG. 1, a top-down view of a pair of semiconductor devices is shown. A first device 104 and a second device 106 are formed on a semiconductor substrate 102. A shared gate 108 extends over the first device 104 and the second device 106. The first device 104 has a first device type (e.g., a pFET) and the second device 106 has a second device type (e.g., an nFET). Although the devices will be described herein with the first device 104 being an pFET and the second device being an nFET, with appropriate respective work function metals, it should be understood that these roles may be reversed, so that the first device 104 may be an nFET and the second device 106 may be a pFET, each with work function metals of the appropriate polarity. Certain steps and layers may differ, depending on which work function metal is deposited first, as will be described in greater detail below. In some examples, the two devices may have the same polarity, but may nonetheless use different work function metals.

Devices will be referred to herein in terms of their "type" or "polarity." These terms may refer to n-type and p-type devices, and may further relate to species of dopants that are embedded in a semiconductor material to change the properties of the semiconducting material. Whereas a natural semiconductor, such as silicon, may have four valence electrons in its outer shell, a p-type dopant may have three valence electrons in its outer shell and an n-type dopant may have five valence electrons in its outer shell. The inclusion of a p-type dopant thereby adds a "hole" to the semiconductor material, carrying an effective positive charge, while the inclusion of an n-type dopant adds an electron to the semiconductor material, carrying a negative charge. The addition of such dopants may enhance the natural semiconducting properties of the base semiconductor material and may be used to form devices with specified properties. For example, in an n-type transistor device may act as a switch that is biased open, where an above-threshold applied voltage closes the switch. In contrast, a p-type transistor device may act as a switch that is biased closed, where an above-threshold applied voltage opens the switch.

nFETs and pFETs may be formed by providing structures with differing doping types. In a pFET, the channel may have an n-type dopant and the source/drain structures may have a p-type dopant. In an nFET, the channel may have a p-type dopant and the source/drain structures may have an n-type dopant. In such devices, the gate is isolated from the channel by a gate dielectric. When a voltage is applied to the gate, the electrical field created by the accumulation of charge on the gate causes charge carriers to move into or out of the channel, either creating or depleting a conductive path between the source and drain structures.

A set of cross-sections are indicated, showing views of different portions of the devices. A first cross-section, indicated as AA, cuts across both the first device 104 and the second device 106 in a gate region. A second cross-section, indicated as BB, cuts lengthwise through the first device 104. A third cross-section, indicated as CC, cuts lengthwise through the second device 106. These cross-sections will be shown in subsequent views to illustrate how the three dimensional structure of the devices develops. The different views may not be drawn to scale, to allow for direct comparison of the qualitative features.

Figure 2:
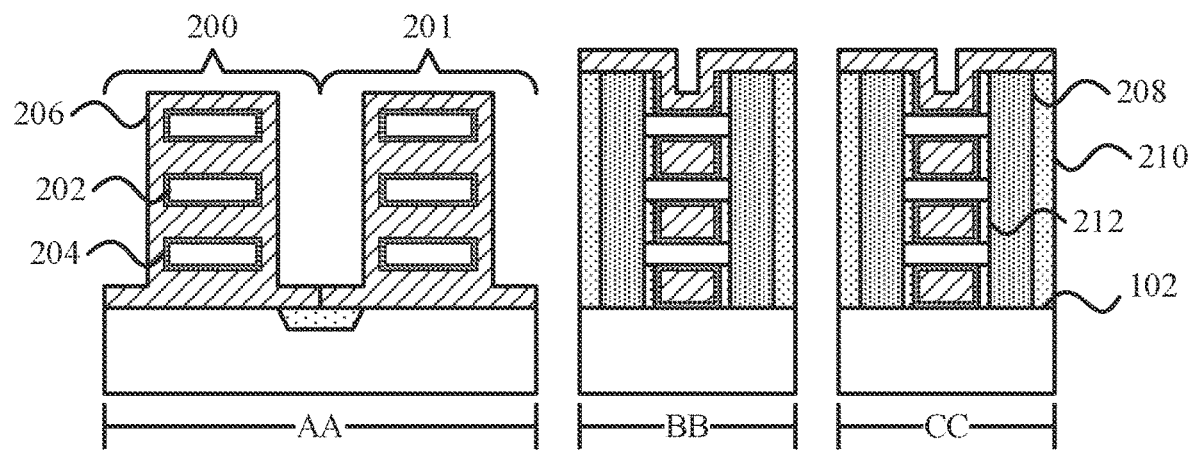
FIG. 2 is a set of cross-sectional views of a step in the fabrication of a semiconductor device having transistors with different work function metals, showing the formation of a first work function metal across two device regions, in accordance with an embodiment of the present invention.

Referring now to FIG. 2, cross-sections AA, BB, and CC are shown of a step in the fabrication of a semiconductor device. Two device regions have been identified, including first device region 200 and second device region 201. The two device regions 200 and 201 are illustrated as being adjacent to one another, separated by a shallow trench isolation (STI) region, but it should be understood that these regions may be in any location on the chip. While two adjacent devices of differing polarity may be used to form linked devices, such as complementary field effect transistors (CFETs), the present principles apply regardless of where the devices are formed on a given substrate.

At this stage, a set of channel layers 202 have already been formed from semiconductor material, such as silicon or silicon germanium. Source/drain structures 208 have been formed on surfaces of the channels 202 and may include a doped epitaxial semiconductor material. Inner spacers 212 are formed between the channels 202 from an appropriate dielectric material, such as silicon dioxide or silicon nitride. A gate dielectric layer 204 may be conformally formed on the exposed portions of the channels 202. An interfacial layer (not shown) may be formed above the channels 202 before the gate dielectric layer 204 is formed. A first work function metal layer 206 is conformally deposited over the gate dielectric layer and sidewalls, filling the space between the channels 202. The gate dielectric layer 204 separates the first work function metal layer 206 from the channels 202. A passivating dielectric 210 is formed around the source/drain structures 208.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The gate dielectric 204 may be formed from any appropriate dielectric material, such as a high-k dielectric. A high-k dielectric is a material having a higher dielectric constant than that of silicon dioxide. Exemplary high-k dielectric materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The first work function metal layer 206 may be selected in accordance with a device polarity. Thus, p-type work function metals and n-type work function metals may be used to form the first work function metal layer 206. The first work function metal layer 206 will be addressed with specific reference to p-type work function metals herein, but the polarity of the two device regions and their work function metals may be reversed. In some examples, the two devices may have the same polarity, but may nonetheless use different work function metals.

A p-type work function metal causes a p-type threshold voltage shift. For example, the work function of a p-type work function metal layer may range from 4.9 eV to 5.2 eV. As used herein, "threshold voltage" is the lowest attainable gate voltage that will turn on a semiconductor device, such as a transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. Exemplary p-type work function metals include metal nitride like titanium nitride, tantalum nitride, tungsten nitride, and a composite of metal nitride with tungsten. The first work function metal layer 206 is deposited over the first device region 200 and the second device region 201.

The channels 202 are shown being surrounded by the gate stack, so that the first device and the second device are gate-all-around (GAA) devices with multiple channel structures. It should be understood that the present principles may be applied to other types of transistor devices, such as fin FETs and planar FETs, where a GAA structure may not be possible. Additionally, the channels 202 are shown as being nanosheet structures, with a width substantially larger than the height (e.g., with a ratio of 2:1 or greater). However, the channels 202 may have other structures as well, such as a nanowire structure with a width-to-height ratio less than 2:1.

This stage is shown after several processing steps have already been performed to create the illustrated structures. In this particular example, with nanosheet channels 202, the channels may be formed by creating a stack of alternating channel layers and sacrificial semiconductor layers, for example by successive steps of epitaxial growth. The source/drain structures 208 may be epitaxially grown from the exposed sidewalls of the channels 202, for example with in situ doping to set their polarity. However, it should be understood that the present principles may be applied to any appropriate channel structures, formed by any appropriate process. Thus, for example, a fin FET may be formed by etching a fin out of a semiconductor substrate, with source/drain structures that are formed by implanting dopant via ion bombardment.

Figure 3:
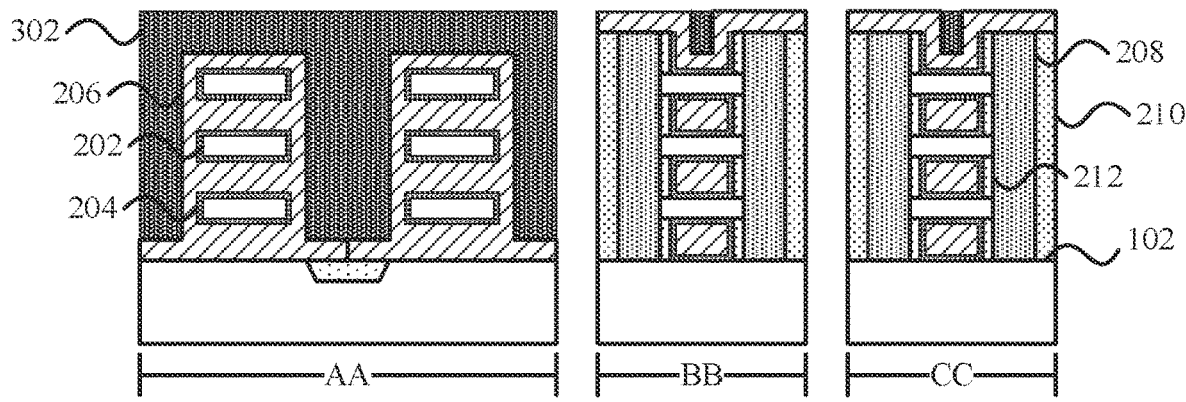
FIG. 3 is a set of cross-sectional views of a step in the fabrication of a semiconductor device having transistors with different work function metals, the formation of a dummy gate layer over the first work function metal, in accordance with an embodiment of the present invention.

Referring now to FIG. 3, cross-sections AA, BB, and CC are shown of a step in the fabrication of a semiconductor device. A dummy gate 302 is formed over the exposed first work function metal layer 206 by any appropriate deposition process. For example, polysilicon may be deposited using chemical vapor deposition (CVD), atomic layer deposition (ALD), or physical vapor deposition (PVD) to a height that covers the structures shown in cross-sections BB and CC. Excess dummy gate material may be removed by, e.g., polishing the polysilicon material down to the level of the first work function metal layer 206, for example using a chemical mechanical planarization (CMP) process that stops on the material of the first work function metal layer 206.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

CMP is performed using, e.g., a chemical or granular slurry and mechanical force to gradually remove upper layers of the device. The slurry may be formulated to be unable to dissolve, for example, the first work function metal layer material 206, resulting in the CMP process's inability to proceed any farther than that layer.

Figure 4:
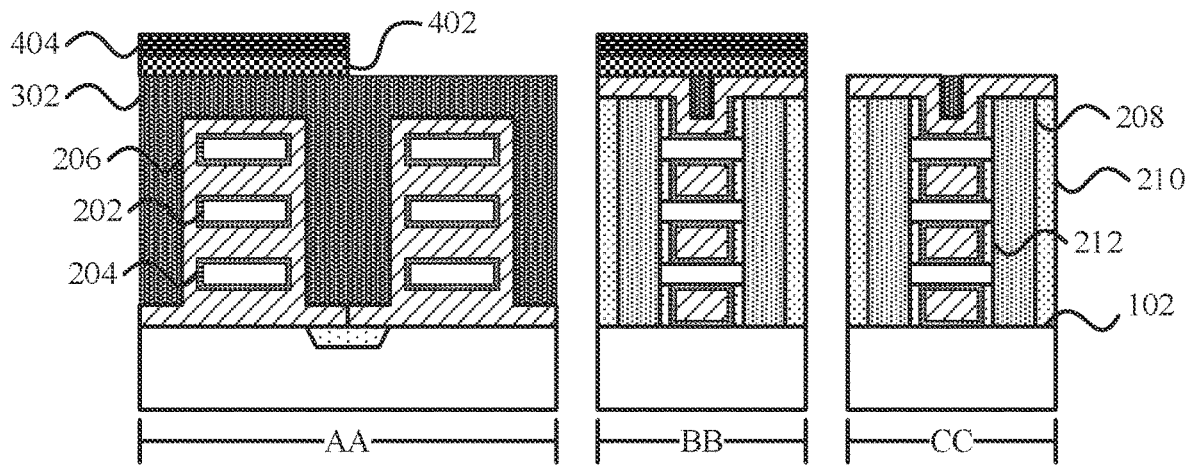
FIG. 4 is a set of cross-sectional views of a step in the fabrication of a semiconductor device having transistors with different work function metals, showing the formation of a mask over a first device region, in accordance with an embodiment of the present invention.

Referring now to FIG. 4, cross-sections AA, BB, and CC are shown of a step in the fabrication of a semiconductor device. A mask 402 is formed on the dummy gate by depositing a layer of masking material, such as titanium nitride, with a layer of organic planarizing material over it. The organic planarizing material may be patterned using any appropriate photolithographic process to expose the masking material above the second device region 201. The exposed masking material may then be etched away with a selective anisotropic etch, leaving behind mask 402 and organic planarizing layer (OPL) 404. An additional layer of lanthanum oxide may be used in addition to the masking material to form the mask 402. For pFET devices, the mask 402 may include layer of titanium nitride over a layer of lanthanum oxide ($La_2O_3$).

To pattern the OPL 404, the organic planarizing material may be exposed to a pattern of radiation. The pattern may then be developed using a developer chemical, with unwanted portions of the organic planarizing material being removed to expose the underlying layers. The etch of the exposed masking material may be removed by a selective etch, with the term "selective" referring to a material removal process denotes that the rate of material removal for a first material is greater than the rate of removal for at least another material of the structure to which the material removal process is being applied.

Any appropriately selective anisotropic etching process, such as a reactive ion etch (RIE) may be used to remove the exposed portions of the masking material. RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface.

Figure 5:
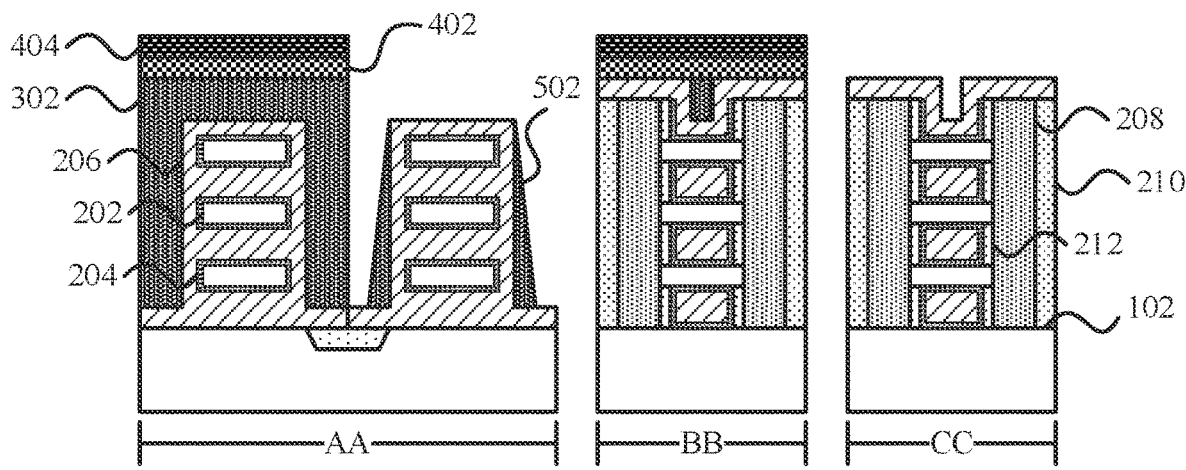
FIG. 5 is a set of cross-sectional views of a step in the fabrication of a semiconductor device having transistors with different work function metals, showing partial anisotropic etch of the dummy gate material in a second device region, in accordance with an embodiment of the present invention.

Referring now to FIG. 5, cross-sections AA, BB, and CC are shown of a step in the fabrication of a semiconductor device. Exposed portions of the dummy gate 302 in the second device region 201 are etched away using a selective anisotropic etch. The etch exposes the top surface of the first work function metal layer 206 in the second device region 201.

Notably, the anisotropic etch need not completely remove the residue 502 from sidewalls of the second device region 201. An RIE process may not be perfectly selective between the polysilicon material of the dummy gate 302 and the gate dielectric 204. As a result, using an RIE process for a long duration to remove all of the dummy gate material in the second region 201 could cause damage to the gate dielectric 204. The RIE process may therefore be used to remove the majority of the dummy gate 302 in the second device region 201, leaving a residue 502 of dummy gate material.

Figure 6:
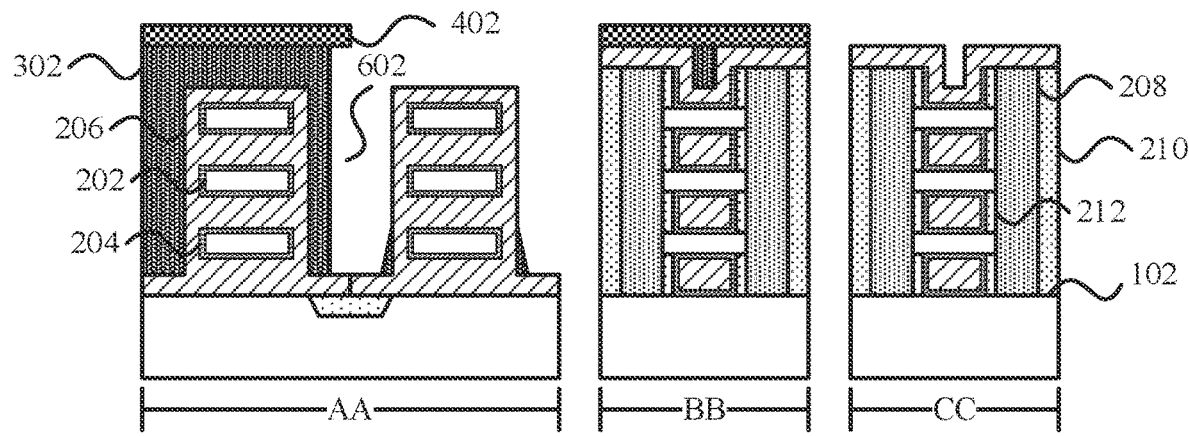
FIG. 6 is a set of cross-sectional views of a step in the fabrication of a semiconductor device having transistors with different work function metals, showing an isotropic etch of the dummy gate material that undercuts the mask in the first device region, in accordance with an embodiment of the present invention.

Referring now to FIG. 6, cross-sections AA, BB, and CC are shown of a step in the fabrication of a semiconductor device. An isotropic etch selectively removes dummy gate material from all exposed surfaces, including the vertical sidewall of the dummy gate 302 in the first device region 200. The lateral etch into the first device region 200 creates an undercut 602 beneath the mask 402. The isotropic etch may be a wet or dry chemical etch and may be timed to limit the lateral extent of the undercut 602, so that the first work function metal layer 206 in the first device region 200 remains protected. The isotropic etch may also remove some or all of the dummy gate residue 502 from the second device region 201.

Figure 7:
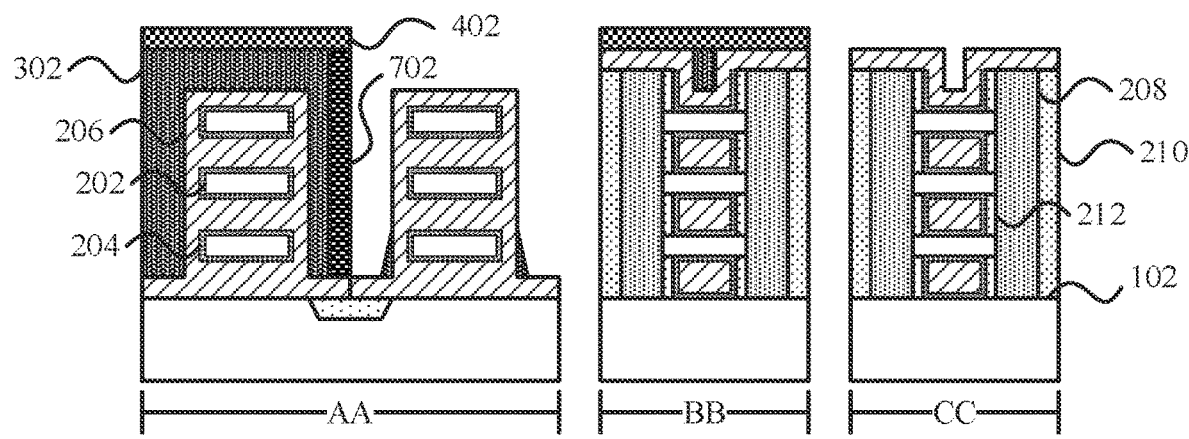
FIG. 7 is a set of cross-sectional views of a step in the fabrication of a semiconductor device having transistors with different work function metals, showing the formation of a barrier layer in the undercut of the first device region, in accordance with an embodiment of the present invention.

Referring now to FIG. 7, cross-sections AA, BB, and CC are shown of a step in the fabrication of a semiconductor device. A barrier 702 is formed in the undercut 602, for example using a conformal deposition of organic planarizing material, followed by a selective and anisotropic etch to remove any of the organic planarizing material that is exposed outside of the undercut 602. The anisotropic etch of the organic planarizing material may be sufficiently selective that it does not cause significant damage to the structures of the second device region 201.

Figure 8:
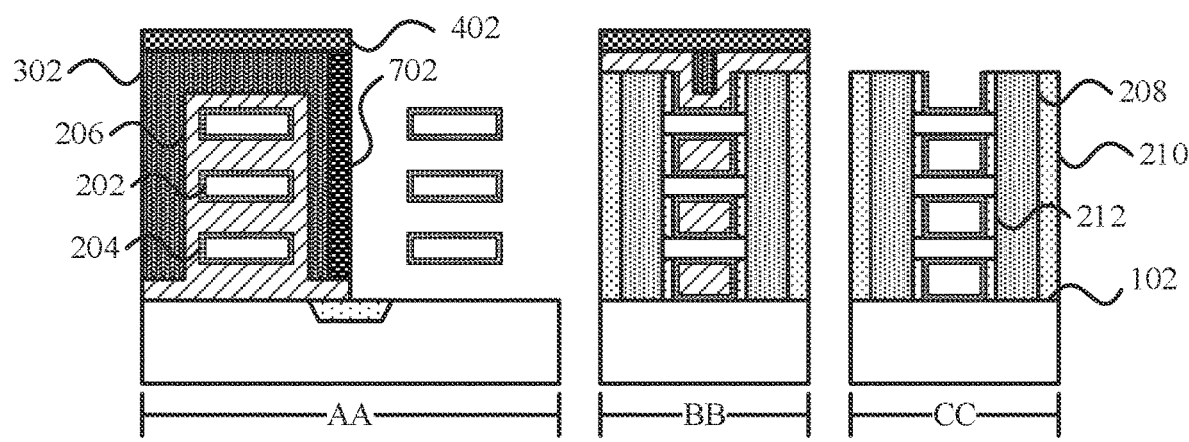
FIG. 8 is a set of cross-sectional views of a step in the fabrication of a semiconductor device having transistors with different work function metals, showing the selective removal of the first work function metal from the second device region, in accordance with an embodiment of the present invention.

Referring now to FIG. 8, cross-sections AA, BB, and CC are shown of a step in the fabrication of a semiconductor device. Any remaining residue 502 may be etched away, for example using an isotropic etch, while the mask 402 and the barrier 702 protect the dummy gate 302 in the first device region 200. The exposed portions of the first work function metal layer 206 may be selectively and isotropically etched away, exposing top and bottom surfaces of the channels 202 in the second device region 201.

Figure 9:
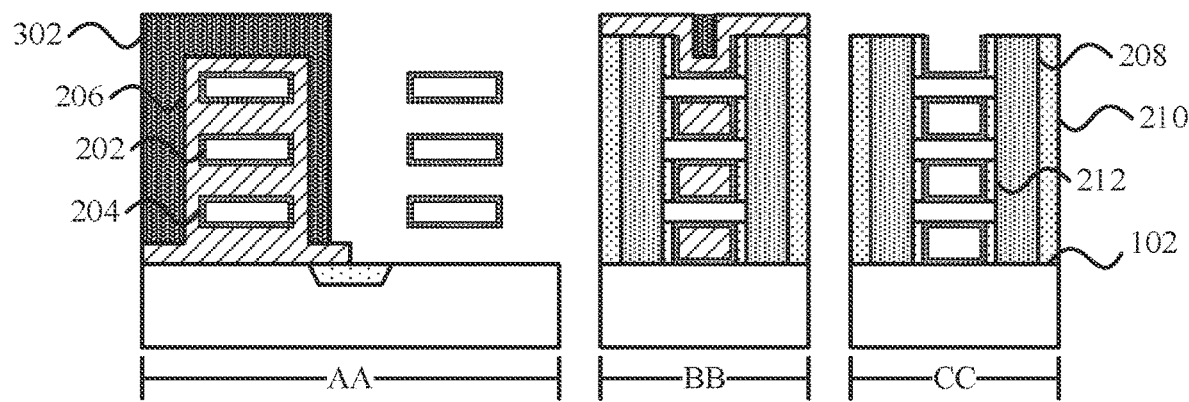
FIG. 9 is a set of cross-sectional views of a step in the fabrication of a semiconductor device having transistors with different work function metals, showing the removal of the barrier layer from the first device region, in accordance with an embodiment of the present invention.

Referring now to FIG. 9, cross-sections AA, BB, and CC are shown of a step in the fabrication of a semiconductor device. The mask 402 may be selectively etched away to expose the top surface of the dummy gate 302 in the first device region 200, and the barrier 702 may also be selectively etched away to expose the side surface of the dummy gate 302 in the first device region 200, for example using an isotropic etch.

Figure 10:
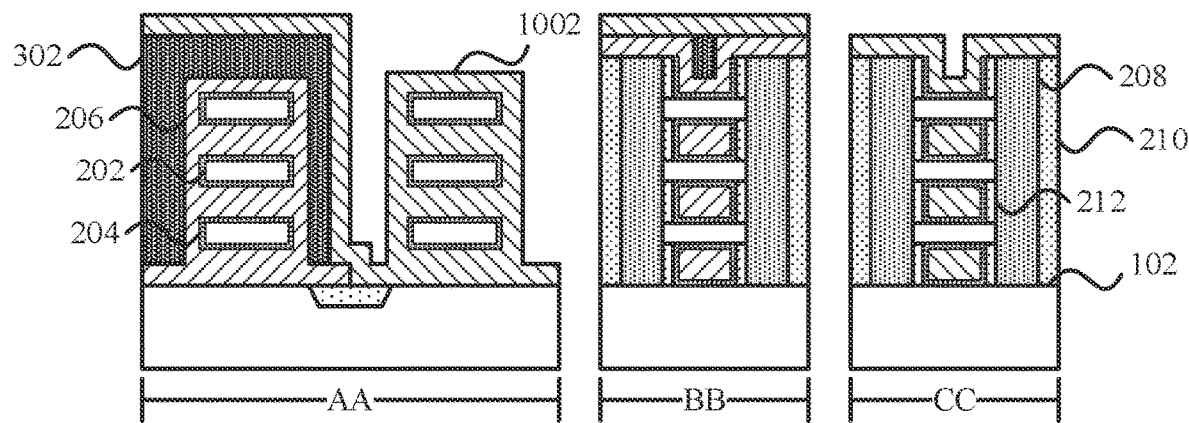
FIG. 10 is a set of cross-sectional views of a step in the fabrication of a semiconductor device having transistors with different work function metals, showing the formation of a second work function metal in the second device region, in accordance with an embodiment of the present invention.

Referring now to FIG. 10, cross-sections AA, BB, and CC are shown of a step in the fabrication of a semiconductor device. A second work function metal layer 1002 may be conformally deposited across exposed surfaces, to a thickness that completely fills spaces between the channels 202 in the second device region 201. The second work function metal layer 1002 may furthermore be formed on sidewalls and the top surface of the dummy gate 302 in the first device region 200. The dummy gate 302 separates the second work function metal layer 1002 from the first work function metal layer 206 that remains in the first device region 201.

The second work function metal layer 1002 may be formed from an n-type work function metal if the first work function metal layer 206 is formed from a p-type work function metal. In the event that the first work function metal layer 206 is formed from an n-type work function metal, then the second work function metal layer 1002 may be formed from a p-type work function metal.

An n-type work function metal causes an n-type threshold voltage shift. For example, the work function of a n-type work function metal layer may range from 4.1 eV to 4.3 eV. The term "n-type threshold voltage shift" as used herein means a shift in the Fermi energy of an n-type semiconductor device towards a conduction band of silicon in the silicon containing substrate of the n-type semiconductor device. A "conduction band" is the lowest lying electron energy band of the doped material that is not completely filled with electrons. Exemplary n-type work function metals include aluminum- or titanium-containing alloys such as pure titanium, pure aluminum, titanium aluminum (TiAl), titanium aluminum carbide (TiAlC), tantalum aluminum carbide (TaAlC), tantalum titanium carbide (TaTiC), aluminum carbide (AlC), and a combination of metal nitride and aluminum- or titanium-containing alloys such as a TiN/TiAlC/TiN stack.

Figure 11:
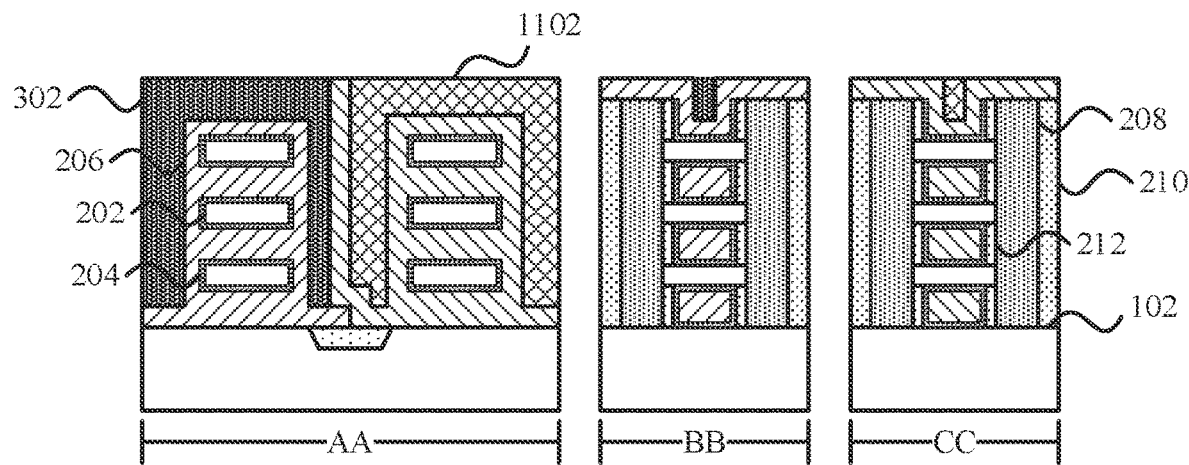
FIG. 11 is a set of cross-sectional views of a step in the fabrication of a semiconductor device having transistors with different work function metals, showing the formation of a second gate conductor over the second work function metal in the second device region, in accordance with an embodiment of the present invention.

Referring now to FIG. 11, cross-sections AA, BB, and CC are shown of a step in the fabrication of a semiconductor device. A second gate conductor 1102 is deposited in the second device region 201 using any appropriate deposition process and conductive material. The conductive material may be filled to a height above the dummy gate 302 and may then be polished down using a CMP process that stops on the material of the dummy gate 302. This polishing process further removes portions of the second work function metal layer 1002 that are positioned over the dummy gate 302, so that the top surface of the dummy gate 302 is exposed.

The second gate conductor 1102 may be formed from any appropriate conductive metal such as, e.g., titanium nitride, tungsten, aluminum, nickel, titanium, molybdenum, tantalum, copper, platinum, silver, gold, ruthenium, iridium, rhenium, rhodium, cobalt, and alloys thereof. The second gate conductor 1102 may alternatively be formed from a doped semiconductor material such as, e.g., doped polysilicon.

Figure 12:
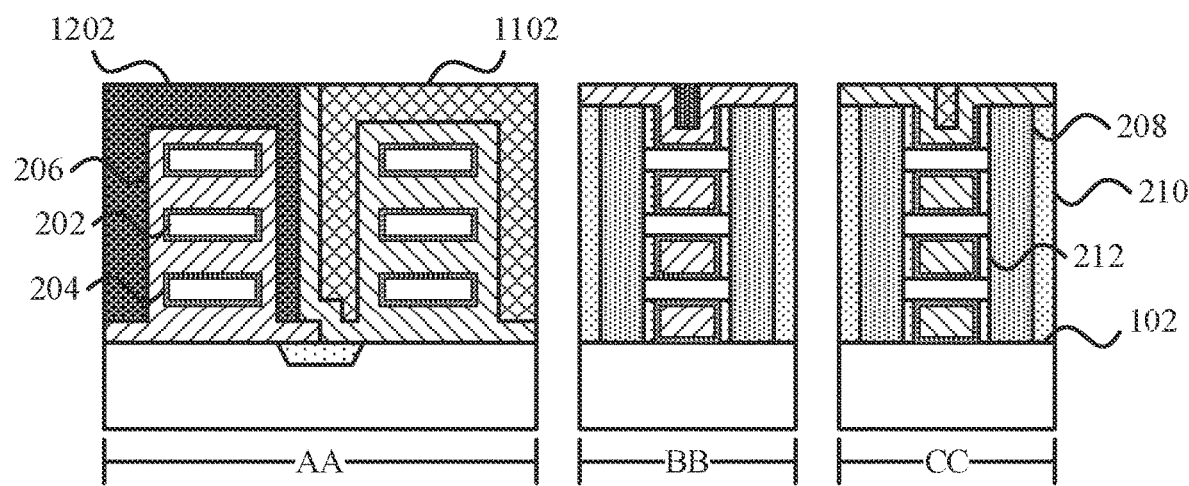
FIG. 12 is a set of cross-sectional views of a step in the fabrication of a semiconductor device having transistors with different work function metals, showing the formation of a first gate conductor over the first work function metal in the first device region, in accordance with an embodiment of the present invention.

Referring now to FIG. 12, cross-sections AA, BB, and CC are shown of a step in the fabrication of a semiconductor device. The dummy gate 302 may be etched away and a first gate conductor 1202 may be formed in the first device region 200 using any appropriate deposition process. The first gate conductor 1202 and the second gate conductor 1102 may be formed from the same conductive material or may be formed from different conductive materials. For example, the first gate conductor 1202 may be formed from titanium nitride, while the second gate conductor 1102 may be formed from tungsten. Any differences in height between the two gate conductors may be filled in with additional conductive material, such as tungsten.

The present embodiments may include examples where a pFET device is formed first and examples where an nFET is formed first. A wetting layer may be used to help conductive material, such as tungsten, adhere to structures. Such a wetting layer may include a layer of titanium nitride. In pFET-first embodiments, the wetting layer may be optional, as a layer of lanthanum oxide may protect the titanium nitride in the nFET region, and so an additional layer of titanium nitride may not be needed. In such embodiments, the wetting layer may remain in the final structure of the nFET device, acting as part of the gate contact.

Figure 13:
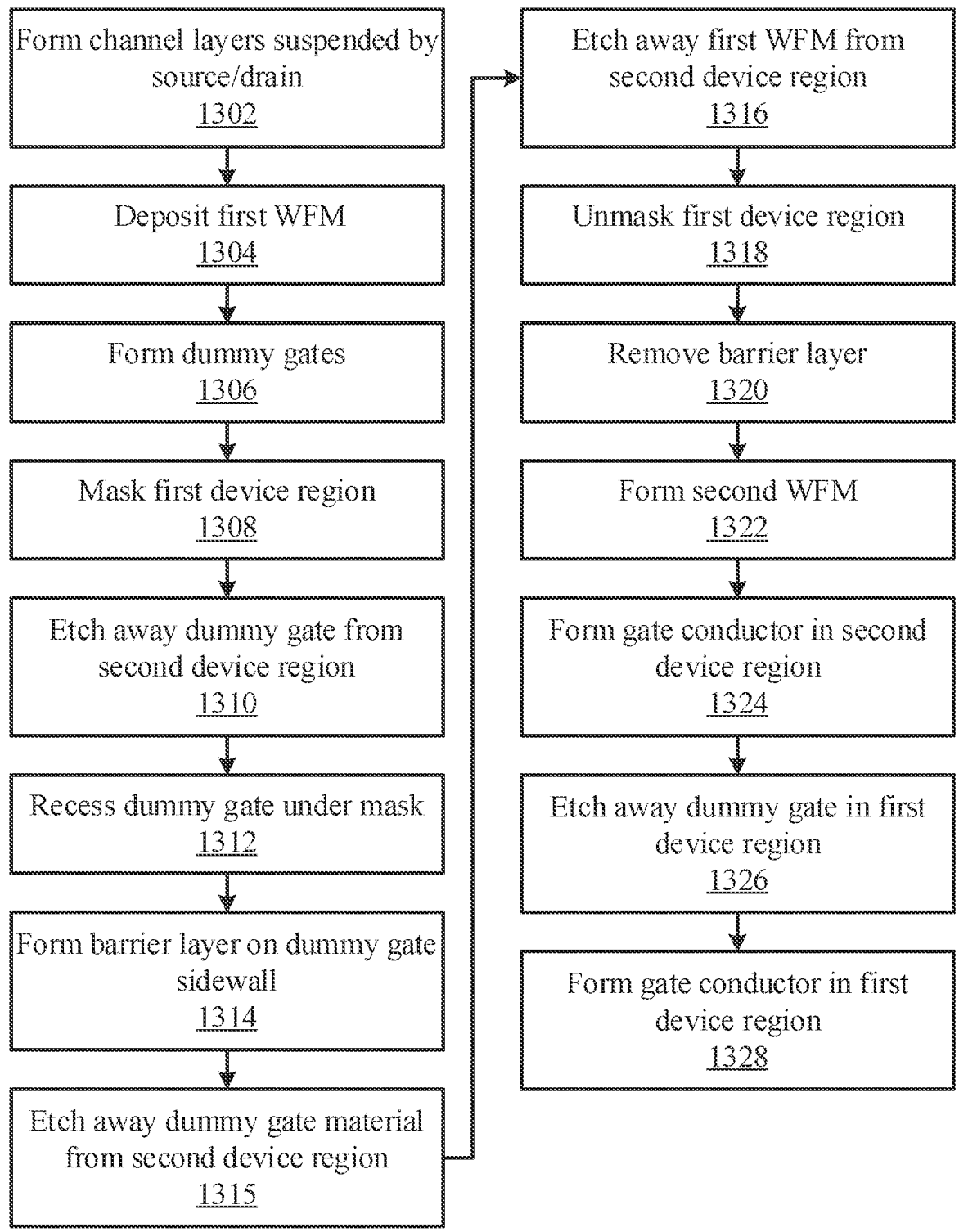
FIG. 13 is a block/flow diagram of a method of forming a semiconductor device having transistors with different work function metals, in accordance with an embodiment of the present invention.

Referring now to FIG. 13, a method of forming a semiconductor device is shown. Block 1302 forms channel layers 202 that are suspended by source/drain structures 208. As described above, there may be a first device region 200 and a second device region 201, each with its own channel or channel layers 202. Block 1304 conformally deposits a first work function metal 206 that surrounds the exposed portions of the channels 202 in both the first device region 200 and the second device region 201.

Block 1306 forms dummy gates 302 across the first device region 200 and the second device region 201 using any appropriate deposition process. The material of the dummy gates 302 may be any appropriate material having etch selectivity with other structures of the device, such as polysilicon. Block 1308 masks the first device region 200, for example using a photolithographic patterning process that leaves the second device region 201 exposed.

Block 1310 anisotropically etches away the dummy gate 302 from the second device region 201. Block 1312 performs an isotropic etch of the dummy gate material, recessing the dummy gate 302 in the first device region 200 underneath the mask 402. Block 1314 then forms a barrier layer 702 on the sidewall of the recessed dummy gate, for example by depositing an organic planarizing material using any appropriate deposition process and then anisotropically etching any material that is not protected by the mask 402.

Block 1315 etches away any remaining dummy gate material from the second device region 201 using a selective isotropic etch. Block 1316 etches away the first work function metal 206 from the second device region 201 using a selective isotropic etch, exposing the gate dielectric 204 in the second device region 201.

Block 1318 removes the mask 402 and block 1320 removes the barrier layer 702 from the dummy gate 302 of the first device region 200. Block 1322 then conformally deposits a second work function metal over the first device region 200 and the second device region 201 and polishes the second work function metal down to the dummy gate 302 to form a second work function metal layer 1002.

Block 1324 forms a second gate conductor 1102 on the second work function metal layer 1002. Block 1326 etches away the dummy gate 302 from the first device region 200 and block 1328 forms a first gate conductor on the first work function metal layer 206.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising," "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower." "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of non-overlapping gate conductors for GAA transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
   a first transistor on a substrate having:
      a first work function metal layer; and
      a first gate conductor over the first work function metal layer and having a vertical sidewall; and
   a second transistor on the substrate having:
      a second work function metal layer that overlaps a portion of the first work function metal layer of the first transistor and that has a vertical part above the portion of the first work function metal layer relative to the substrate and in direct contact with the vertical sidewall of the first gate conductor;
      a second channel; and
      a second gate conductor over the second work function metal layer, in contact with a sidewall of the vertical part of the second work function metal layer, between the vertical part of the second work function metal layer and the second channel.

2. The semiconductor device of claim 1, wherein the first work function metal layer is formed from a material of a first polarity and the second work function metal layer is formed from a material of a second polarity.

3. The semiconductor device of claim 1, wherein the first transistor and the second transistor include respective nanosheet channels.

4. The semiconductor device of claim 1, wherein the first gate conductor and the second gate conductor are formed from different conductive materials.

5. The semiconductor device of claim 1, wherein the first transistor includes a first channel and wherein no part of the second work function metal layer is directly over the first channel.

6. The semiconductor device of claim 1, wherein the first transistor is a p-type transistor and the first work function metal layer includes a p-type work function metal and wherein the second transistor is an n-type transistor and the second work function metal layer includes an n-type work function metal.

7. The semiconductor device of claim 1, wherein the second transistor is a p-type transistor and the second work function metal layer includes a p-type work function metal and wherein the first transistor is an n-type transistor and the first work function metal layer includes an n-type work function metal.

8. A semiconductor device, comprising:
   a first transistor that includes:
      a first channel over a substrate;
      a first work function metal layer on the first channel; and
      a first gate conductor over the first work function metal layer; and
   a second transistor that includes;
      a second channel over the substrate;
      a second work function metal layer, on the second channel, that overlaps a portion of the first work function metal layer and that has a vertical part above the portion of the first work function metal layer relative to the substrate, wherein no part of the second work function metal layer is directly over the first channel; and a second gate conductor over the second work function metal layer.

9. The semiconductor device of claim 8, wherein the first gate conductor has a vertical sidewall and wherein the vertical part of the second work function metal layer is in direct contact with the vertical sidewall of the first gate conductor.

10. The semiconductor device of claim 9, wherein the second gate conductor is in contact with a sidewall of the vertical part of the second work function metal layer, between the vertical part of the second work function metal layer and the second channel.

* * * * *